Sept. 25, 1962 D. C. CRAWFORD 3,056,094
TRANSISTOR D.C. TO A.C. CONVERTER
Filed Sept. 26, 1960
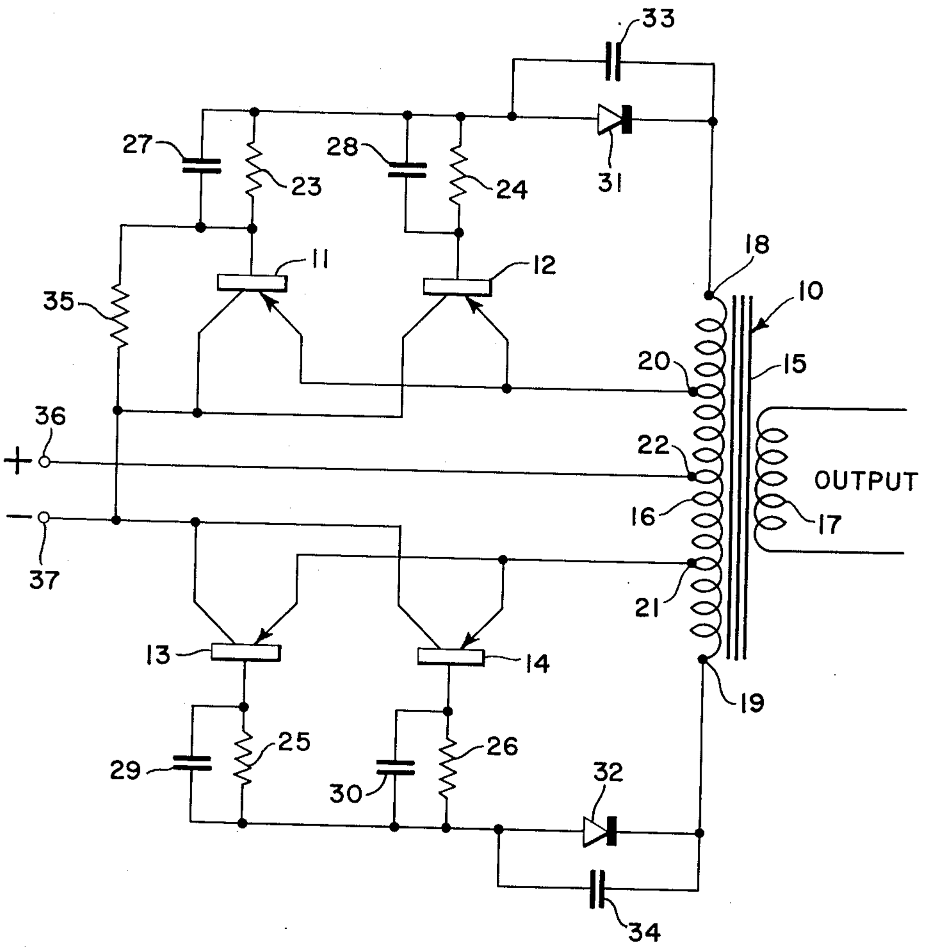
INVENTOR
Duncan C. Crawford
BY
Stevens, Davis, Miller & Mosher
ATTORNEYS 3,056,094

TRANSISTOR D.C. TO A.C. CONVERTER

Duncan C. Crawford, Bellaire, Tex., assignor to Texas Instruments Incorporated, Dallas, Tex., a corporation of Delaware Filed Sept. 26, 1960, Ser. No. 58,304
1 Claim. (Cl. 331—113)

This invention relates to a transistor oscillator, the function of which is to convert D.C. power to A.C. power.

Transistor oscillators are often used for converting low level direct current voltage to high level direct current voltage or for converting direct current voltage to alternating current voltage. Such circuits are well known in the art, having been in wide spread use for several years. Among the drawbacks of using transistor oscillators as D.C. to A.C. converters is the limitation on the amount of current which a transistor may conduct. The output current, and thus the output power, of a transistor converter is thereby limited. One way to increase the current output is to connect a plurality of transistors in parallel to oscillate in synchronism. This type of circuit is commonly used in vacuum tube converters. If transistor circuits equivalent to the vacuum tube converters of the prior art are used, then the transistors used in the circuits must be carefully matched. Otherwise, one of the transistors will take over the whole load of the output current and the benefit of using the parallel transistors will be lost. In practice, matching to the degree necessary is very difficult to achieve and totally impractical when a large number of transistors are connected in parallel.

The circuit of the present invention comprises a transistor oscillator in which a large number of unmatched transistors may be connected in parallel with all of the transistors sharing substantially equally the output load current. This balance is achieved by connecting a resistor in series with the base electrode of each transistor. The value of each of these resistors controls the base bias current for its associated transistor independently. This independent control enables the base bias currents of each of the transistors to be adjusted so that each transistor contributes substantially equally to the output load current even though the transistors used are not matched.

Further objects and advantages of the present invention will become readily apparent as the following detailed description of the preferred embodiment of the invention unfolds and when taken in conjunction with the single FIGURE of the drawings which illustrates the circuits of the specific embodiment of the invention.

As shown in the figure, the converter comprises four PNP transistors 11–14 and a transformer 10. The collectors of the transistors 11 and 12 are connected together and their emitters are connected together. The collectors of the transistors 13 and 14 are connected together and the emitters of these transistors are also connected together. The transformer 10 comprises a core 15 of magnetic material which may have a substantially square hysteresis loop. A primary winding 16 and a secondary winding 17 are wound upon the core 15. The primary winding 16 has two end terminals 18 and 19, a mid-tap terminal 22, a terminal 20 positioned between the terminals 18 and 22 and the terminal 21 positioned between the terminals 19 and 22. The emitters of the transistors 11 and 12 are connected directly to the terminal 20 and the emitters of the transistors 13 and 14 are connected directly to the terminal 21. A resistor 23 connects the base of the transistor 11 to terminal 18 through diode 31. A resistor 24 connects the base of the transistor 12 to the terminal 18 through the diode 31. A resistor 25 connects the base of the transistor 13 to terminal 19 through diode 32. A resistor 26 connects the base of the transistor 14 to the terminal 19 through the diode 32. The resistors 23—26 are shunted by capacitors 27 through 30 respectively. The diodes 31 and 32 are shunted by capacitors 33 and 34 respectively. A power input terminal 36 is connected to the terminal 22 of the primary winding 16. A second power input terminal 37 is connected to the collectors of the transistors 11, 12, 13 and 14. A resistor 35 connects the terminal 37 to the base of the transistor 11.

The operation of the circuit is conventional, for the most part. The positive pole of a D.C. power supply is applied to terminal 36 and the negative pole is applied to terminal 37. When the power is applied to terminals 36 and 37, the circuit will oscillate with first the transistors 11 and 12 conducting and the transistors 13 and 14 cut off and alternately with the transistors 13 and 14 conducting and the transistors 11 and 12 cut off. When the transistors 11 and 12 start to conduct, the increasing current flowing in the primary winding 16 between terminals 20 and 22 will induce an increasing negative potential at terminal 18 and an increasing positive potential at terminal 19. The negative swing in potential produced at terminal 18 is applied to the bases of transistors 11 and 12 through capacitors 33, 27 and 28 and the positive swing in potential at terminal 19 is applied to the bases of transistors 13 and 14 through capacitors 29, 30 and 34. Thus, the conduction through the transistors 11 and 12 is regenerated, due to the build up of the negative potential at the base of these transistors, while at the same time transistors 13 and 14 are driven into cut off by the build up of the positive potential at their bases. When the current through the transistors 11 and 12 causes the magnetic core 15 to saturate, the current flowing in the winding 16 between terminals 20 and 22 will stop increasing and the voltage generated at terminal 18 will drop to zero as well as that at terminal 19. This drop in voltage at terminal 18 will be applied to the bases of transistors 11 and 12 causing a drop in the conduction through these transistors. As the conduction decreases through transistors 11 and 12, the current in the primary winding 16 between terminals 20 and 22 will decrease. This decrease in current will cause a positive potential to be generated at terminal 18 and a negative potential to be generated at terminal 19. The negative potential generated at terminal 19, when applied to the bases of the transistors 13 and 14, will cause these transistors to start to conduct and current to flow through the primary winding 16 between terminals 21 and 22. This current flowing between terminals 21 and 22 in the winding 16 will cause the voltage induced at terminal 19 to become more negative and the voltage at terminal 18 to become more positive. Thus the conduction of the transistors 13 and 14 is regenerated because of the build up of the negative potential applied to the bases of these transistors from terminal 19 while simultaneously the transistors 11 and 12 are driven quickly into cut off by the positive potential generated at terminal 18. In like manner, when the current through transistors 13 and 14 causes the magnetic core 16 to saturate, the negative voltage generated at terminal 19 will drop, thus causing a decrease in the conduction through transistors 13 and 14 and a decrease in conduction in the primary winding between terminals 21 and 22. This decreasing current in the primary winding will induce a negative potential at terminal 18 and a positive potential at terminal 19. Thus the cycle will start over again with the conduction building up in the transistors 11 and 12 and being cut off in the transistors 13 and 14.

The resistor 35 serves the function of making the circuit initially unbalanced when the power is first applied. The connection of this resistor makes the base of the transistor 11 substantially negative with respect to its emitter when the power is first applied so that the build up of current in the part of the primary winding between terminals 20 and 22 will be substantially greater than the build up of current between terminals 21 and 22. If the build up were at the same rate, the induced potentials would exactly cancel out each other and there would therefore be no oscillation.

The resistors 23—26 have values which are large relative to the internal impedances of the transistors 11—14 to their base currents. Thus the base bias currents for the transistors 11—14 are determined by the values of the resistors 23—26, respectively, rather than the transistor characteristics and each base bias current is individually controlled. The values of the resistors 23—26 are selected to provide base currents such that each of the transistors will share substantially equally in the output load current. This effect will be achieved if the resistors 23—26 have substantially the same resistance.

Diodes 31 and 32 in conjunction with capacitors 33 and 34 serve as de-spiking networks to protect the transistors 11, 12, 13, and 14 from the large inductive potential generated by the circuit each half cycle. The de-spiking networks also effectively reduce the noise generated within the circuit.

Although the present invention has been shown and described with reference to a particular embodiment, nevertheless various changes and modifications obvious to those skilled in the art are deemed to be within the spirit and scope of the invention.

What is claimed is:

A symmetrical push-pull D.C. to A.C. converter circuit comprising:

(*a*) a first plurality of transistors connected in parallel with all collectors connected together and all emitters connected together, (*b*) a second plurality of transistors connected in parallel with all collectors connected together and all emitters connected together, (*c*) a transformer having a center-tapped primary winding and a secondary winding, (*d*) a D.C. source connecting all of the collectors of said first and second plurality of transistors to the center-tap of said primary winding, (*e*) the emitters of all of said first plurality of transistors being connected to a point on said primary winding intermediate said center-tap and one end thereof, (*f*) the emitters of all of said second plurality of transistors being connected to a point on said primary winding intermediate said center-tap and the other end thereof, (*g*) a first diode and a first capacitor connected in parallel with one common point being connected to said one end of said primary winding, (*h*) a plurality of like resistors separately connecting each of the bases of said first plurality of transistors to the other common point of said first diode and said first capacitor to provide equal current flow in said first plurality of transistors, (*i*) a second diode and a second capacitor connected in parallel with one common point being connected to said other end of said primary winding, (*j*) another plurality of like resistors separately connecting each of the bases of said second plurality of transistors to the other common point of said second diode and said second capacitor to provide equal current flow in said second plurality of transistors, (*k*) and a third resistor connecting the base of one of said first plurality of transistors to the collector thereof to promote starting of oscillations in said converter.

References Cited in the file of this patent

Electronics, August 7, 1959. Page 60, TK7800E58.

High-Power Transistor D.C. Converters by Pye, in Electronic & Radio Engineer, March 1959, pages 96–105.